(12) United States Patent
Chuang et al.

(10) Patent No.: US 9,466,714 B2
(45) Date of Patent: *Oct. 11, 2016

(54) VERTICAL TUNNELING FIELD-EFFECT TRANSISTOR CELL WITH COAXIALLY ARRANGED GATE CONTACTS AND DRAIN CONTACTS

(71) Applicant: Taiwan Semiconductor Manufacturing Company, Ltd., Hsin-Chu (TW)

(72) Inventors: Harry-Hak-Lay Chuang, Singapore (SG); Cheng-Cheng Kuo, Hsinchu (TW); Ming Zhu, Singapore (SG)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/704,592

(22) Filed: May 5, 2015

(65) Prior Publication Data

US 2015/0236153 A1 Aug. 20, 2015

Related U.S. Application Data

(63) Continuation of application No. 13/773,462, filed on Feb. 21, 2013, now Pat. No. 9,029,940.

(51) Int. Cl.
| | |
|---|---|
| *H01L 29/78* | (2006.01) |
| *H01L 29/417* | (2006.01) |
| *H01L 27/088* | (2006.01) |
| *H01L 29/423* | (2006.01) |
| *H01L 23/535* | (2006.01) |

(52) U.S. Cl.
CPC ......... *H01L 29/7827* (2013.01); *H01L 23/535* (2013.01); *H01L 27/088* (2013.01); *H01L 29/41741* (2013.01); *H01L 29/42356* (2013.01)

(58) Field of Classification Search
None
See application file for complete search history.

(56) References Cited

U.S. PATENT DOCUMENTS

| | | |
|---|---|---|
| 5,192,989 A | 3/1993 | Matsushita et al. |
| 5,382,816 A | 1/1995 | Mitsui |
| 5,635,742 A | 6/1997 | Hoshi et al. |
| 6,312,980 B1 | 11/2001 | Rostoker et al. |
| 6,319,785 B1 | 11/2001 | Ha et al. |
| 6,407,434 B1 | 6/2002 | Rostoker et al. |
| 6,531,737 B2 | 3/2003 | Okada et al. |
| 6,710,413 B2 | 3/2004 | Thei et al. |

(Continued)

OTHER PUBLICATIONS

Han Zhao, Y. Chen, Y. Wang, F. Zhou, F. Xue, and J. Lee, In0.7Ga0.3As Tunneling Field-Effect Transistors with an Ion of 50 µA/µm and a Subthreshold Swing of 86 mV/Dec using HfO2 Gate Oxide, IEEE Electron Device Letters, vol. 31, No. 12, Dec. 2010, pp. 1392-1394.

(Continued)

*Primary Examiner* — Ali Naraghi
(74) *Attorney, Agent, or Firm* — Haynes and Boone, LLP

(57) ABSTRACT

A tunneling field-effect transistor (TFET) device includes a source region, a gate stack, and a drain region. The TFET device further includes a source contact on the source region, a plurality of gate contacts on a planar portion of the gate stack, and a plurality of drain contacts on the drain region. The gate contacts are aligned on a first plurality of lines that intersect at a common point on the source region from a top view. The drain contacts are aligned on a second plurality of lines that intersect at the common point from the top view.

20 Claims, 5 Drawing Sheets

(56) References Cited

U.S. PATENT DOCUMENTS

| | | |
|---|---|---|
| 7,514,324 B2 | 4/2009 | Leslie |
| 7,524,751 B2 | 4/2009 | Ryu |
| 7,910,982 B2* | 3/2011 | Oyu ............... H01L 21/743 257/328 |
| 7,999,313 B2 | 8/2011 | Kim |
| 8,207,032 B2 | 6/2012 | Fischer et al. |
| 8,405,121 B2 | 3/2013 | Gossner et al. |
| 8,415,209 B2 | 4/2013 | Rooyackers et al. |
| 8,686,402 B2* | 4/2014 | Goel et al. ............... 257/24 |
| 8,698,254 B2 | 4/2014 | Tomioka et al. |
| 8,754,470 B1 | 6/2014 | Chuang et al. |
| 8,901,640 B2 | 12/2014 | Masuoka et al. |
| 8,969,974 B2 | 3/2015 | Liaw |
| 9,029,940 B2* | 5/2015 | Chuang ............... H01L 29/7827 257/135 |
| 2004/0126944 A1 | 7/2004 | Pacheco Rotondaro et al. |
| 2010/0207202 A1 | 8/2010 | Ueda |
| 2011/0303973 A1 | 12/2011 | Masuoka et al. |
| 2014/0203350 A1 | 7/2014 | Chuang et al. |
| 2014/0203351 A1 | 7/2014 | Chuang et al. |
| 2014/0203352 A1* | 7/2014 | Chuang ............. H01L 29/66356 257/329 |
| 2014/0291616 A1* | 10/2014 | Park ................. H01L 29/66356 257/27 |

OTHER PUBLICATIONS

Mohata D., et al., Experimental Staggered-Source and N+ Pocket-Doped Channel III-V Tunnel Field-Effect Transistors and Their Scalabilities, App Phys Express, 4 (2011).

Sterkel, M. et al., Characteristics and Optimisation of Vertical and Planar Tunnelling-FETs, J. of Phys, Conference Series, 10, (2005).

Schmid, H. et al., Fabrication of Vertical InAs-Si Heterojunction Tunnel Field Effect Transistors, IEEE Device Research Conference (2011).

* cited by examiner

VERTICAL TUNNELING FIELD-EFFECT TRANSISTOR CELL WITH COAXIALLY ARRANGED GATE CONTACTS AND DRAIN CONTACTS

PRIORITY DATA

This application is a continuation of U.S. application Ser. No. 13/773,462, filed on Feb. 21, 2013, and entitled "A Vertical Tunneling Field-Effect Transistor Cell," the entirety of which is hereby incorporated by reference.

CROSS-REFERENCE

This application is related to the following applications, the disclosures of which are hereby incorporated by reference:

A Vertical Tunneling Field-Effect Transistor Cell And Fabricating The Same, Ser. No. 13/745,459, filed Jan. 18, 2013.

A Vertical Tunneling Field-Effect Transistor Cell And Fabricating The Same, Ser. No. 13/745,225, filed Jan. 18, 2013, now issued as U.S. Pat. No. 8,754,470.

A Vertical Tunneling Field-Effect Transistor Cell And Fabricating The Same, Ser. No. 13/745,579, filed Jan. 18, 2013.

A Vertical Tunneling Field-Effect Transistor Cell And Fabricating The Same, Ser. No. 13/749,186, filed Jan. 24, 2013.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

However, as the size of the smallest component has decreased, numerous challenges have risen. As features become closer, current leakage can become more noticeable, signals can crossover more easily, and power usage has become a significant concern. The semiconductor integrated circuit industry has produced numerous developments in its effort to continue the process of scaling. One of the developments is the potential replacement or supplementation of the conventional MOS field-effect transistor by the tunneling field-effect transistor (TFET).

Tunneling FETs are promising devices that may enable further scaling of power supply voltage without substantially increasing off-state leakage currents due to its sub-60 mV/dec subthreshold swing. However, existing TFETs have not been satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
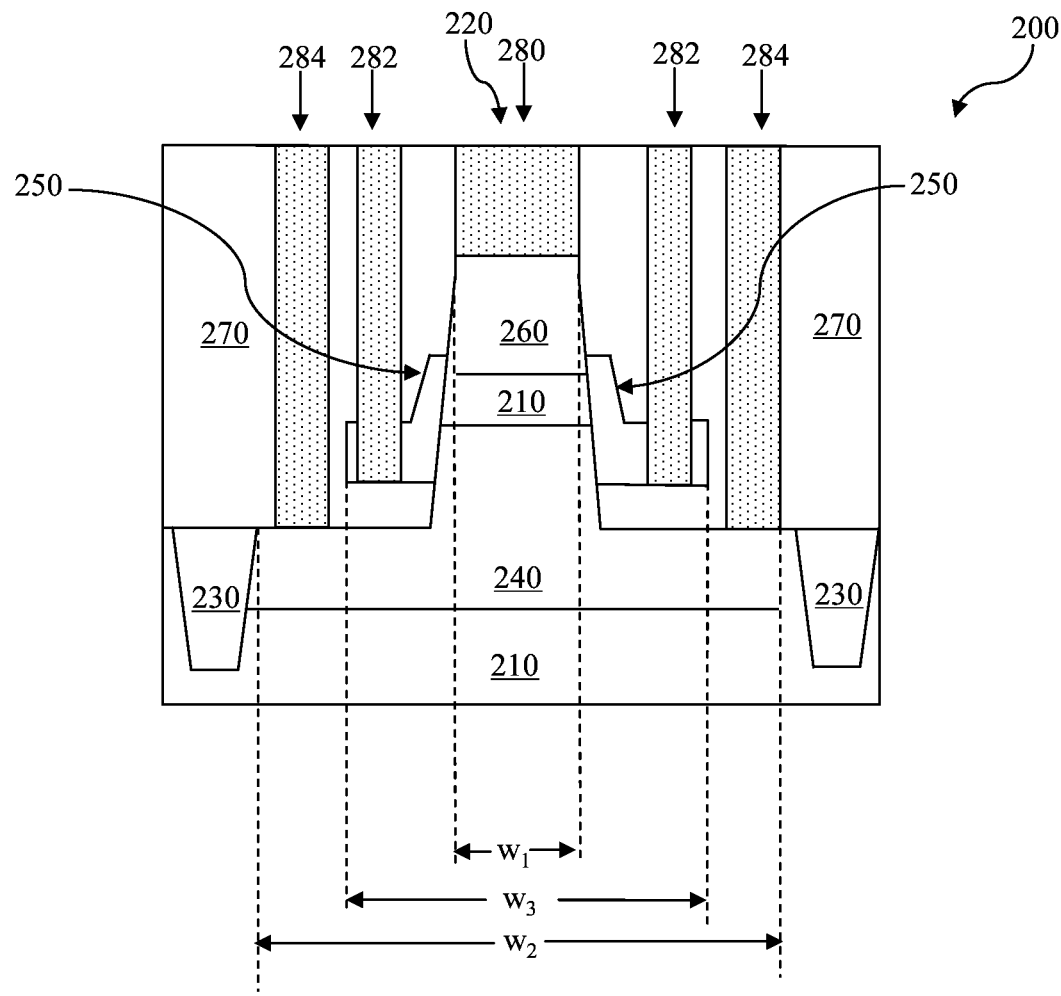
FIG. 1 is a cross-section view of semiconductor device according to one embodiment.

FIG. 1 depicts a tunneling field-effect transistor (TFET) 200. The TFET device 200 includes a silicon substrate 210. In alternative embodiments, the substrate 210 may include germanium, silicon germanium, gallium arsenide, silicon carbide, indium arsenide, indium phosphide, gallium arsenic phosphide, gallium indium, or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials. The substrate 210 may also include various p-type doped regions and/or n-type doped regions, implemented by a process such as ion implantation and/or diffusion. Those doped regions include n-well and p-well.

The TFET device 200 also includes a protrusion structure 220 with a first width $w_1$, which protrudes out of the plane of substrate 210. The protrusion structure 220 may be formed by lithography and etching processes. The etch process may include wet etch, dry etch, or a combination thereof. The protrusion structure 220 can be formed with sidewalls having an angle with the planar surface of the substrate 210 ranging from approximately 45 degrees to around 90 degrees. In one embodiment, the protrusion structure 220 is formed as a cylinder shape. Alternatively, the protrusion structure 220 is formed as square-column, oval cylinder, rectangular column, regular hexagonal column, or other polygon-column shape.

The TFET device 200 also includes isolation features 230 formed on the substrate 210, including between each protrusion structure 220. The isolation features 230 include different structures formed by using different processing technologies. In one embodiment, the isolation features 230 are shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench.

The TFET device 200 also includes a drain region 240 with a second width $w_2$ on the substrate 210. The second width $w_2$ is substantially larger than the first width $w_1$. In one embodiment, the drain region 240 is concentric with the protrusion structure 220. The drain region 240 may be formed by doping and annealing. In the present embodiment, the drain region 240 is formed such that it is adjacent to the protrusion structure 220 and extends to a bottom portion of the protrusion structure 220, referred as to a raised drain region 240. For a p-type TFET, the drain region 240 may be doped with p-type dopants, such as boron or $BF_2$. For an n-type TFET, the drain region 240 may be doped with n-type dopants, such as phosphorus, arsenic, or a combination thereof.

The TFET device 200 also includes a gate stack 250. The gate stack 250 includes a planar portion which is concentric to the protrusion structure 220 and parallel to the surface of substrate 210, and a gating surface, which wraps around a middle portion of the protrusion structure 220. In one embodiment, the out-of-plane gating surface of gate stack 250 overlaps a portion of the raised drain region 240. The gate stack 250 has a total width, a third width $w_3$. The $w_3$ is substantially larger than the first width $w_1$ of the protrusion structure 220 and less than the second width $w_2$ of the drain region 240.

The gate stack 250 may be formed by a procedure including depositing, photolithography patterning and etching processes. The deposition processes include chemical vapor deposition (CVD), atomic layer deposition (ALD), physical vapor deposition (PVD), metalorganic CVD (MOCVD), other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching process includes a dry etch, a wet etch, or a combination thereof.

In one embodiment, the gate stack 250 is a high-k (HK)/metal gate (MG). The HK/MG includes a gate dielectric layer and a MG. The gate dielectric layer may include an interfacial layer (IL) and a high-k (HK) dielectric layer. The IL includes oxide, HfSiO and oxynitride. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The MG may include a single layer or multi layers, such as a metal layer, a liner layer, a wetting layer, and an adhesion layer. The MG may include Ti, Ag, Al, TiAlN, TaC, TaCN, TaSiN, Mn, Zr, TiN, TaN, Ru, Mo, Al, WN, Cu, W, or any suitable materials.

In another embodiment, the gate stack 250 is a polysilicon gate stack. The polisilicon gate stack may include a gate dielectric layer and a polysilicon layer deposited over the gate dielectric layer. The gate dielectric layer includes silicon oxide, silicon nitride, or any other suitable materials.

The TFET device 200 also includes source region 260 at the top portion of the protrusion structure 220, including overlapping with the gating surface of the gate stack 250. The source region 260 is formed with a different dope type than the drain region 240. In one embodiment, after removing the hard mask, the source region 260 is formed by photolithography patterning, implantation and annealing. In another embodiment, the protrusion structure 220 is recessed first and then the source region 260 is formed at the top portion of the recessed protrusion structure 220 by photolithography patterning, implantation and annealing. In yet another embodiment, a semiconductor material is epitaxially grown on the recessed protrusion structure 220. The semiconductor material layer includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes include CVD deposition techniques (e.g., vapor-phase epitaxy (VPE) and/or ultra-high vacuum CVD (UHV-CVD)), molecular beam epitaxy, and/or other suitable processes. The source region 260 may be in-situ doped during the epitaxy process. In one embodiment, the source region 260 is not in-situ doped, and an implantation process (i.e., a junction implant process) is performed to dope the source region 260.

The TFET device 200 also includes an isolation dielectric layer 270 disposed on the substrate 210, including between the planar portion of the gate stack 250 and the drain region 240, and over the source region 260. The isolation dielectric layer 270 includes silicon oxide, silicon nitride, silicon carbide, oxynitride or other suitable materials. The isolation dielectric layer 270 may include a multiple layers formed by several depositions. Additionally, a CMP process is performed to planarize the top surface of the isolation dielectric layer 270.

The TFET device 200 also includes a source contact 280, gate contacts 282 and drain contacts 284 formed by lithography patterning and etch processes. The etch process includes a dry etch, a wet etch, or a combination thereof. The dry etching process may implement fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), iodine-containing gas, other suitable gases and/or plasmas, and/or combinations thereof. The etching process may include a multiple-step etching to gain etch selectivity, flexibility and desired etch profile. In the present embodiment, in collaboration with selecting of materials of the isolation dielectric layer 270, the contact etching is configured to have an adequate selectivity with respect to the source region 260, the gate stack 250 and the drain region 240. In one embodiment, the gate contact 282 is formed at the planar portion of the gate stack 250.

Figure 2A:
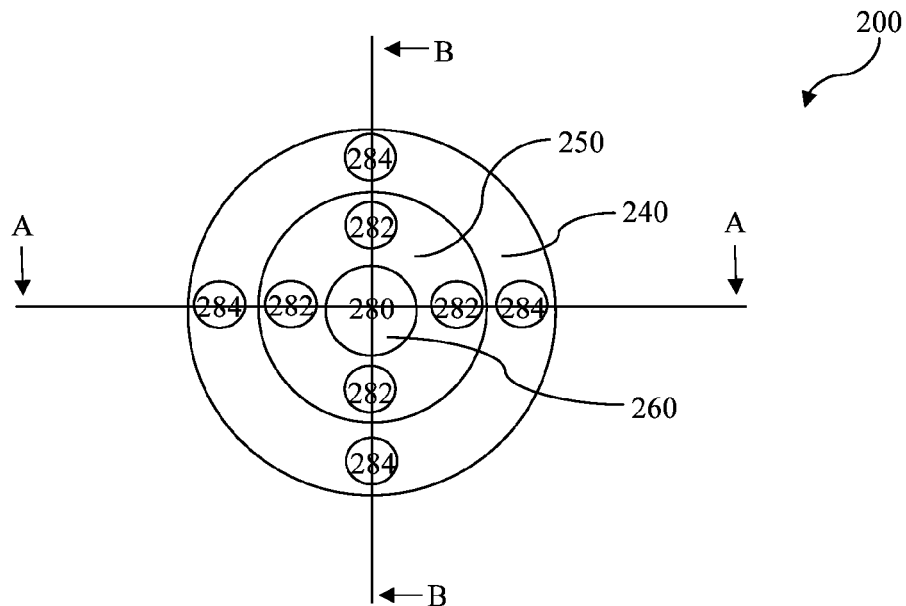
FIGS. 2A and 2B are top, schematic views of the semiconductor device according to one embodiment of FIG. 1.

FIG. 2A depicts one embodiment of the TFET device 200 which has a cylinder shape, and in which the source contact 280, gate contacts 282 and drain contacts 284 are aligned on two perpendicular lines, A-A and B-B. Gate contacts 282 and drain contacts 284 are aligned symmetrically. As an example, the TFET device 200 includes four gate contacts 282 and four drain contacts 284, which are symmetrically positioned in the planar portion of the gate stack and the drain region. Alternatively the TFET 200 may include other suitable polygon-column shapes.

Figure 2B:
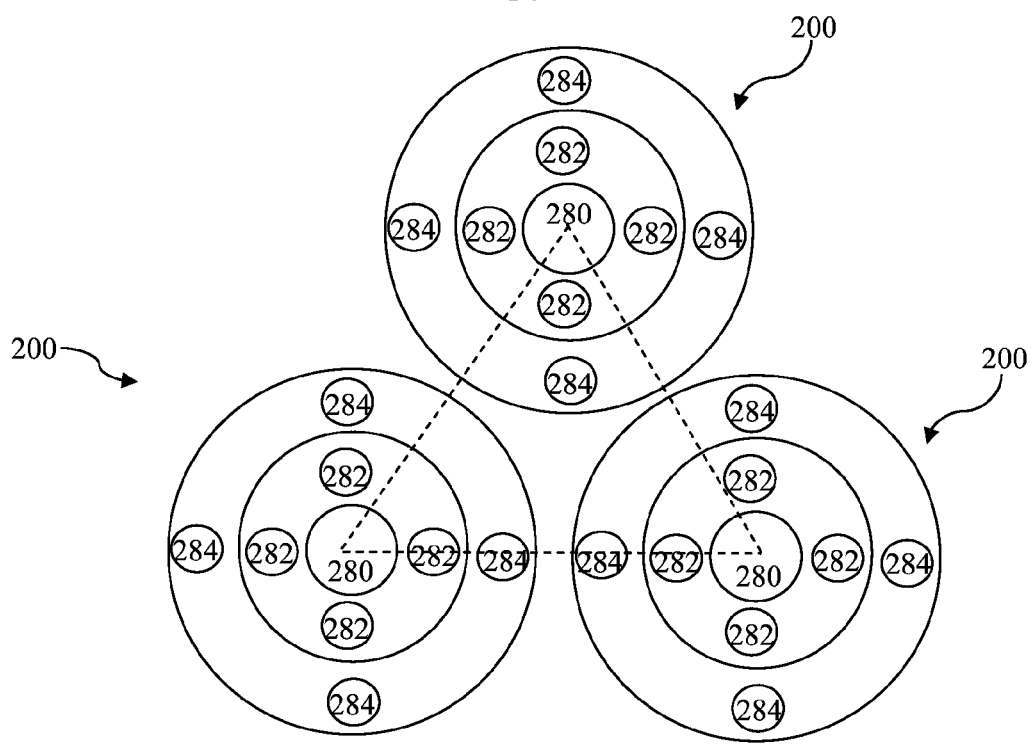

FIG. 2B depicts one embodiment in which the source contacts 280 of three adjacent TFET devices 200 are arranged to be in a position to each other such that the source contact 280 of each TFET device 200 is located at a different vertex of an equilateral triangle, and one edge of the triangle intersects one group of the contacts 282, 284, as shown.

Figure 3A:
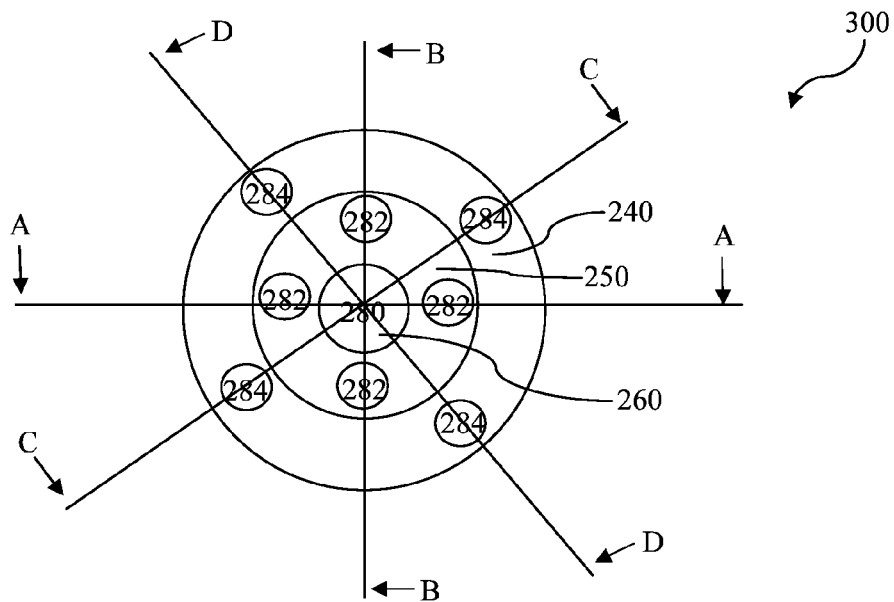
FIGS. 3A and 3B are top, schematic views of a semiconductor device according to another embodiment.

FIG. 3A depicts an alternative embodiment of a TFET device 300 like the TFET device 200. Many aspects of TFET device 300 are shared with TFET device 200, and so much of the disclosure above is applicable here as well. However, the contacts of the TFET device 300 are arranged or laid out differently than those of the TFET device 200. The TFET device 300 has a cylinder shape and the source contact 280. Gate contacts 282 are arranged to align on two perpendicular lines, A-A and B-B. Gate contacts 282 are aligned symmetrically. Drain contacts 284 are arranged to align on two another straight lines, C-C and D-D, each intersecting at a common point and directed 90 degrees from each other. Lines C-C and D-D have 45 degree angle to nearest lines of A-A and B-B respectively. Drain contacts 284 are aligned symmetrically. As an example, the TFET device 300 includes four gate contacts 282 and four drain contacts 284, which are symmetrically positioned in the planar portion of the gate stack and the drain region. Alternatively the TFET 300 may include other suitable polygon-column shapes, such as regular hexagon-column shape and gate contacts 280 and drain contacts 284 are arranged along diagonals symmetrically.

Figure 3B:
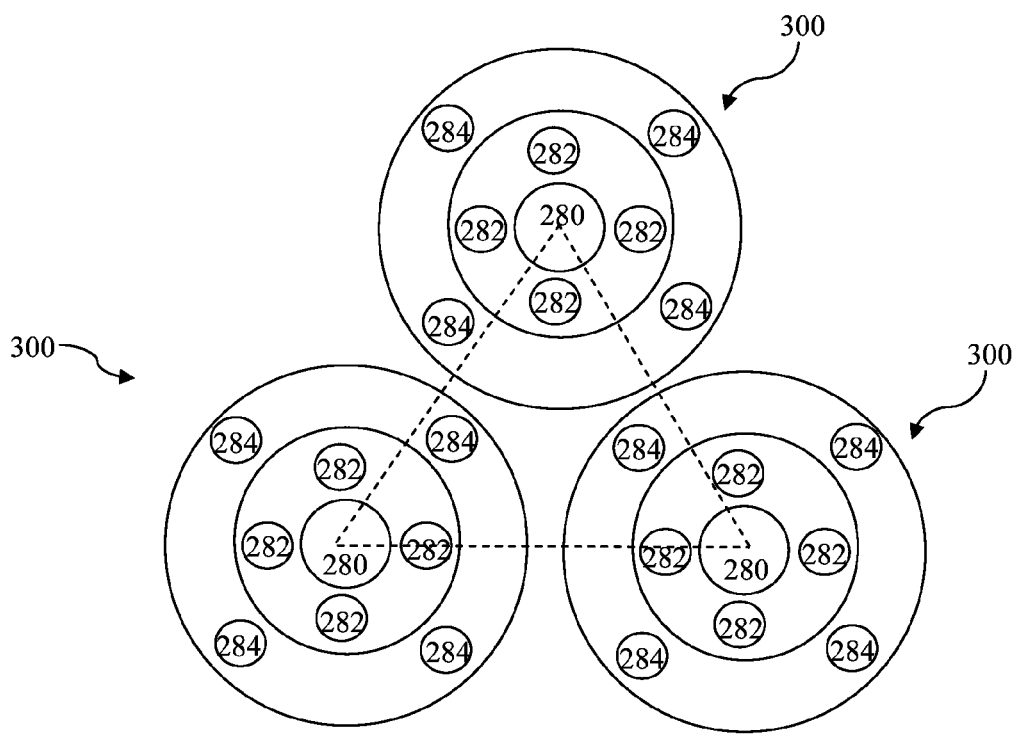

FIG. 3B depicts one embodiment that source contacts 280 of three adjacent TFET devices 300 are arranged to be in a position to each other such that the source contact 280 of each TFET device 300 is located at a different vertex of an equilateral triangle, and all three edges of the triangle intersect respective groups of the contacts 282, 284, as shown.

Figure 4A:
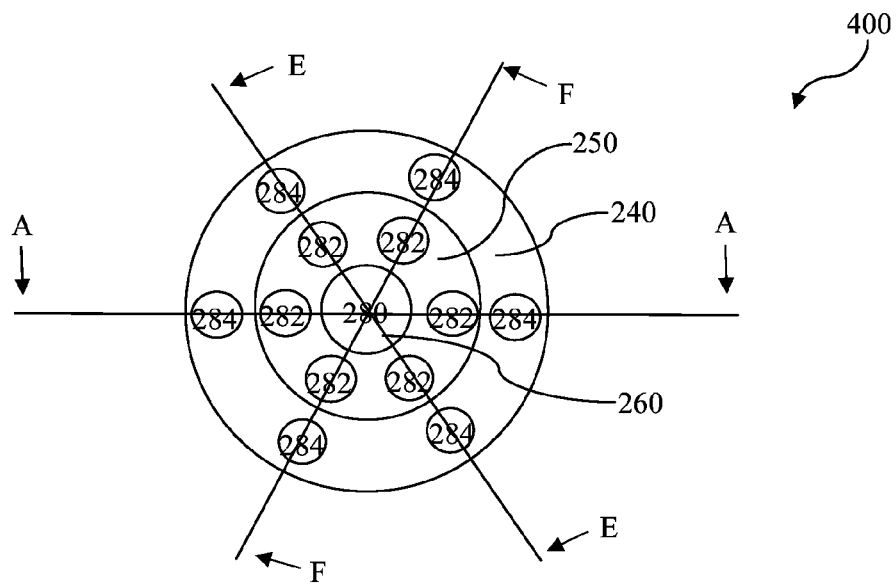
FIGS. 4A and 4B are top, schematic views of a semiconductor device according to yet another embodiment.

FIG. 4A depicts an alternative embodiment of a TFET device 400 like the TFET device 200. Many aspects of TFET device 400 are shared with TFET device 200, and so much of the disclosure above is applicable here as well. However, the contacts of the TFET device 400 are arranged or laid out differently than those of the TFET device 200. The TFET device 400 has a cylinder shape and the source contact 280, gate contacts 282 and drain contacts 284 are arranged to align on three straight lines, A-A, E-E and F-F, each intersecting at a common point and directed 60 degrees from each other. Gate contacts 282 and drain contacts 284 are aligned symmetrically. As an example, the TFET device 400 includes six gate contacts 282 and six drain contacts 284, which are symmetrically positioned in the planar portion of the gate stack and the drain region. Alternatively the TFET 400 may include other suitable polygon-column shapes, such as regular hexagon-column shape and gate contacts 280 and drain contacts 284 are arranged along diagonals symmetrically.

Figure 4B:
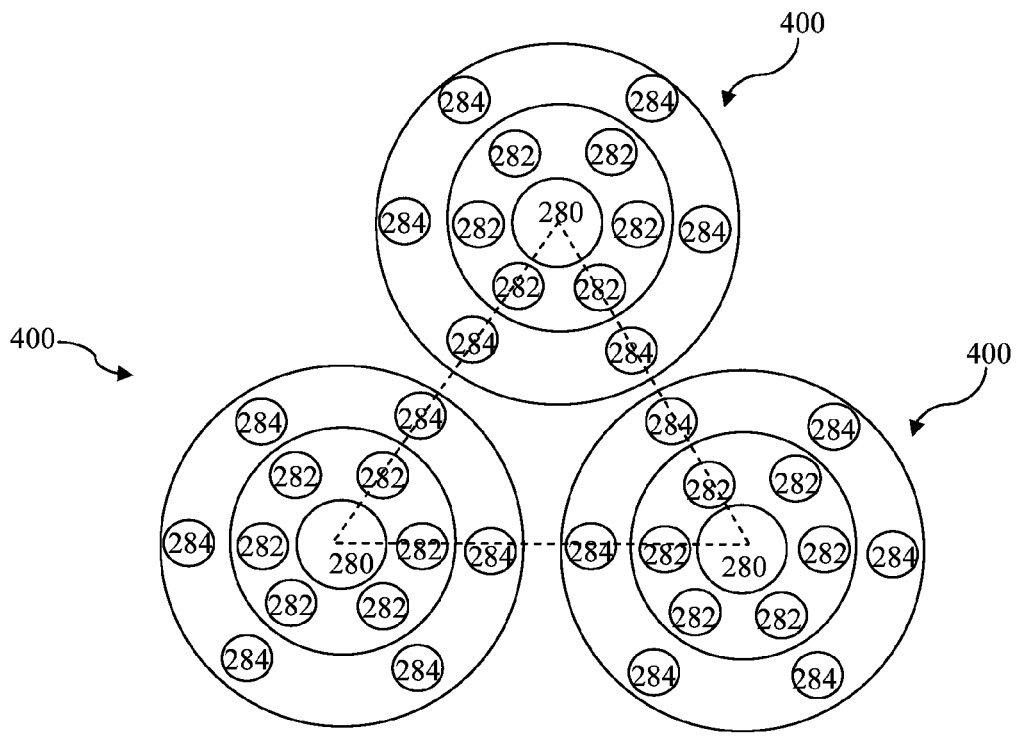

FIG. 4B depicts one embodiment that source contacts 280 of three adjacent TFET devices 400 are arranged to be in a position to each other such that the source contact 280 of each TFET device 400 is located at a different vertex of an equilateral triangle, and all three edges of the triangle intersect respective groups of the contacts 282, 284, as shown.

Figure 5A:
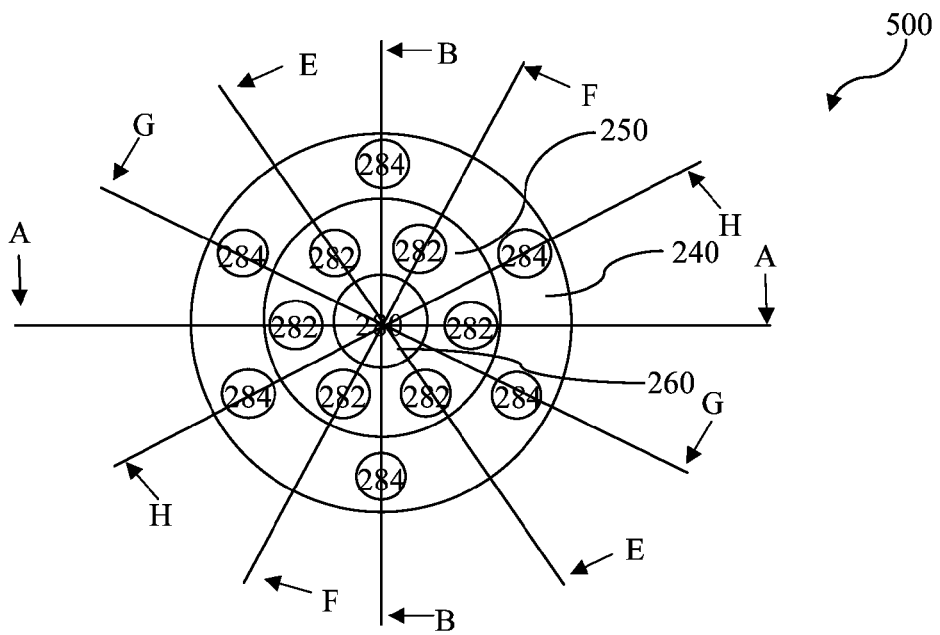
FIGS. 5A and 5B are top, schematic views of a semiconductor device according to yet another embodiment.

FIG. 5A depicts another alternative embodiment of a TFET device 500 like the TFET device 200. Many aspects of TFET device 500 are shared with TFET device 200, and so much of the disclosure above is applicable here as well. However, the contacts of the TFET device 500 are arranged or laid out differently than those of the TFET device 200. The TFET device 500 has a cylinder shape and the source contact 280. Gate contacts 282 are arranged to align on three straight lines, A-A, E-E and F-F, each intersecting at a common point and directed 60 degrees from each other. Gate contacts 282 are aligned symmetrically. Drain contacts 284 are arranged to align on another three straight lines, B-B, G-G and H-H, each intersecting at a common point and directed 60 degrees from each other. They have 30 degree angle to nearest lines of A-A, E-E and F-F, respectively. As an example, the TFET device 500 includes six gate contacts 282 and six drain contacts 284, which are symmetrically positioned in the planar portion of the gate stack and the drain region. Alternatively the TFET 500 may include other suitable polygon-column shapes, such as regular hexagon-column shape and gate contacts 280 and drain contacts 284 are arranged along diagonals symmetrically.

Figure 5B:
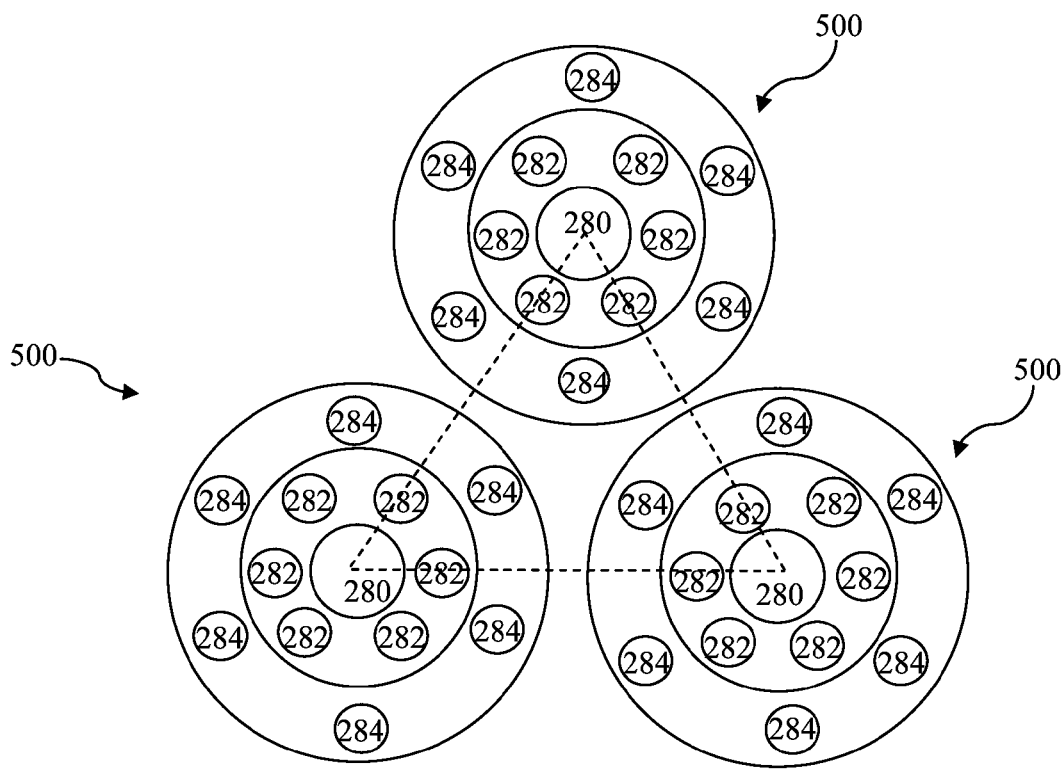

FIG. 5B depicts one embodiment that source contacts 280 of three adjacent TFET devices 500 are arranged to be in a position to each other such that the source contact 280 of each TFET device 500 is located at a different vertex of an equilateral triangle, and all three edges of the triangle intersect respective groups of the contacts 282, 284, as shown.

Embodiments similar to but different from those depicted by TFETs 200 and 300 are within the scope of this disclosure. For example, gate contacts 282 and drain contacts 284 are arranged to align along six straight lines having 30 degree angle between two adjacent lines. For another example, the angle between two adjacent lines, which gate contacts 282 and drain contacts 284 are aligned along, can be any suitable angle. This may allow a circuit designer adding flexibility when laying out a circuit design as the TFETs themselves can be angled as needed.

The TFET device 200, as well as 300, 400 and 500, may undergo further CMOS or MOS technology processing to form various features and regions known in the art. For example, subsequent processing may form various vias/lines and multilayers interconnect features (e.g., metal layers and interlayer dielectrics) on the substrate 210, configured to connect the various features or structures of the TFET devices 200, 300, 400 and 500. For example, a multilayer interconnection includes vertical interconnects, such as conventional and horizontal interconnects, such as metal lines. The various interconnection features may implement various conductive materials including copper, tungsten, and/or silicide. Metal lines can connect contacts/vias such that basing on inline feedback in lithography systems, such as an electron beam lithography system.

Based on the above, the present disclosure offers a vertical TFET device employing arrangements of contacts (including source contact, gate contact and drain contact) and of adjacent vertical TFET devices position to each other. The vertical TFET device with the contact arrangement demonstrates improvement of contact uniformity and relaxing process window for contact photolithography process.

The present disclosure provides many different embodiments of TFET device that provide one or more improvements over other existing approaches. In one embodiment, the TFET device includes a substrate, a protrusion structure disposed over the substrate and protruding out of the plane of substrate, a gate stack disposed over the substrate. The gate stack has a planar portion, which is symmetrically to the protrusion structure and parallel to the surface of substrate and a gating surface, which wraps around a middle portion of the protrusion structure. The TFET device also includes a source region disposed as a top portion of the protrusion structure, including overlapping with a top portion of the gating surface of the gate stack, a drain region disposed over the substrate symmetrically adjacent to the protrusion structure and extending to a bottom portion of the protrusion structure as a raised drain region. The TFET device also includes a source contact on the source region, a gate contact disposed at the planar portion of the gate stack and a drain contact disposed on the drain region. The source contact of the TFET device aligns with other two source contacts of other two adjacent TFET devices such that each source contact locates in one of three angles of an equilateral triangle.

In another embodiment, a vertical TFET device includes a semiconductor substrate, a cylinder shape protrusion disposed over the substrate and protruding out of the plane of semiconductor substrate, a source region at a top portion of the protrusion, a high-k/metal gate (HK/MG) disposed over the semiconductor substrate. The HK/MG has a planar portion, which is symmetrically to the cylinder protrusion and parallel to the surface of semiconductor substrate and a gating surface, which wraps around a middle portion of the cylinder protrusion, including overlapping with the source region. The vertical TFET also includes a drain region disposed over the semiconductor substrate symmetrically adjacent to the cylinder protrusion and extending to a bottom portion of the cylinder protrusion as a raised drain region, an isolation dielectric layer disposed between the planar portion of the HK/MG and the drain region, over the source region and the drain region, a source contact at the source region, a gate contact aligns to the cylinder protrusion, a drain contacts disposed on the drain region. The source contact aligns with other two adjacent source contacts such that each source contact locates in one of three angles of an equilateral triangle In yet another embodiment, a semiconductor device includes a first, second and third cylinder-shape tunneling field-effect transistors (TFETs). Each TFET has a source contact, a plurality gate contacts and a plurality drain contacts. The source contact of the first cylinder-shape TFET aligns with the source contacts of the second and third cylinder-shape TFET such that each source contact locates in one of three angles of an equilateral triangle and gate contacts and drain contacts align symmetrically along more than one straight line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, source and drain regions are often swapped with an appropriate process modification/interchanging, depending on the transistor's eventual use and electrical configuration. Therefore, the terms "source" and "drain" are deemed to be interchangeable under such circumstances. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A tunneling field-effect transistor (TFET) device, comprising:
   a substrate;
   a protrusion structure disposed over the substrate;
   a gate stack disposed over the substrate, wherein the gate stack includes a planar portion and a gating surface, the planar portion is parallel to a top surface of the substrate, and the gating surface wraps around a middle portion of the protrusion structure;
   a source region disposed as a top portion of the protrusion structure;
   a drain region disposed over the substrate adjacent to the protrusion structure and extending to a bottom portion of the protrusion structure as a raised drain region;
   a source contact disposed on the source region;
   a plurality of gate contacts disposed on the planar portion of the gate stack, wherein the plurality of gate contacts includes at least four gate contacts; and
   a plurality of drain contacts disposed on the drain region, wherein the plurality of drain contacts includes at least four drain contacts, and wherein:
   the gate contacts are aligned on a first plurality of lines that intersect at a common point on the source region from a top view, and each of the first plurality of lines goes through at least two of the gate contacts; and
   the drain contacts are aligned on a second plurality of lines that intersect at the common point from the top view, and each of the second plurality of lines goes through at least two of the drain contacts.

2. The TFET device of claim 1, wherein the source contact is positioned at the common point.

3. The TFET device of claim 1, wherein angles that are formed by the first plurality of lines intersecting at the common point are equal.

4. The TFET device of claim 3, wherein the gate contacts are positioned symmetrically about the common point.

5. The TFET device of claim 3, wherein each of the angles is 90 degrees.

6. The TFET device of claim 3, wherein each of the angles is 60 degrees.

7. The TFET device of claim 1, wherein angles that are formed by the second plurality of lines intersecting at the common point are equal.

8. The TFET device of claim 7, wherein the drain contacts are positioned symmetrically about the common point.

9. The TFET device of claim 7, wherein each of the angles is 90 degrees.

10. The TFET device of claim 7, wherein each of the angles is 60 degrees.

11. The TFET device of claim 1, wherein angles that are formed by the first and second pluralities of lines intersecting at the common point are equal.

12. The TFET device of claim 11, wherein each of the angles is 45 degrees.

13. The TFET device of claim 1, wherein the first plurality of lines are the same as the second plurality of lines.

14. A semiconductor device comprising:
    a substrate; and
    a plurality of tunneling field-effect transistors (TFETs) over the substrate, wherein each of the TFETs comprises:
    a source region, a gate region, and a drain region, wherein, from a top view, the source, gate, and drain regions are concentric, the gate region surrounds the source region, and the drain region surrounds the gate region;

a source contact disposed on the source region;

a plurality of gate contacts disposed on the gate region and aligned on a first plurality of lines that intersect at a common point on the source region from the top view, wherein the plurality of gate contacts includes at least four gate contacts, and wherein each of the first plurality of lines goes through at least two of the gate contacts; and a plurality of drain contacts disposed on the drain region and aligned on a second plurality of lines that intersect at the common point from the top view, wherein the plurality of drain contacts includes at least four drain contacts, and wherein each of the second plurality of lines goes through at least two of the drain contacts, and wherein:

the source contact is positioned at the common point, the gate contacts are positioned symmetrically about the common point, and the drain contacts are positioned symmetrically about the common point.

15. The semiconductor device of claim 14, wherein:

in each TFET, the gate contacts are aligned on first and second lines that are perpendicular to each other;

the respective first lines of all TFETs are parallel to each other; and the respective second lines of all TFETs are parallel to each other.

16. The semiconductor device of claim 14, wherein:

in each TFET, the gate contacts are aligned on first, second, and third lines that form six 60 degree angles at the common point;

the respective first lines of all TFETs are parallel to each other;

the respective second lines of all TFETs are parallel to each other; and the respective third lines of all TFETs are parallel to each other.

17. The semiconductor device of claim 14, wherein, in each TFET, the first plurality lines are the same as the second plurality lines.

18. A semiconductor device comprising:

a substrate; and a plurality of tunneling field-effect transistors (TFETs) over the substrate, wherein each of the TFETs comprises:

a protrusion structure disposed over the substrate;

a gate stack disposed over the substrate, wherein the gate stack includes a planar portion and a gating surface, the planar portion is parallel to a top surface of the substrate, and the gating surface wraps around a middle portion of the protrusion structure;

a source region disposed as a top portion of the protrusion structure;

a drain region disposed over the substrate adjacent to the protrusion structure and extending to a bottom portion of the protrusion structure as a raised drain region;

a source contact disposed on the source region;

a plurality of gate contacts disposed on the planar portion of the gate stack, wherein the plurality of gate contacts includes at least four gate contacts; and a plurality of drain contacts disposed on the drain region, wherein the plurality of drain contacts includes at least four drain contacts, and wherein:

from a top view, the source, gate, and drain regions are concentric, the gate region surrounds the source region, and the drain region surrounds the gate region;

the gate contacts are positioned symmetrically about the source contact and are aligned on a first plurality of lines that intersect at the source contact from the top view, and each of the first plurality of lines goes through at least two of the gate contacts; and the drain contacts are positioned symmetrically about the source contact and are aligned on a second plurality of lines that intersect at the source contact from the top view, and each of the second plurality of lines goes through at least two of the drain contacts.

19. The semiconductor device of claim 18, wherein:

in each TFET, the gate contacts and the drain contacts are aligned on first and second lines that are perpendicular to each other;

the respective first lines of all TFETs are parallel to each other; and the respective second lines of all TFETs are parallel to each other.

20. The semiconductor device of claim 18, wherein:

in each TFET, the gate contacts and the drain contacts are aligned on first, second, and third lines that intersect to form six 60 degree angles;

the respective first lines of all TFETs are parallel to each other;

the respective second lines of all TFETs are parallel to each other; and the respective third lines of all TFETs are parallel to each other.

* * * * *